(12) United States Patent  
Joo (10) Patent No.: US 9,414,504 B2  
(45) Date of Patent: Aug. 9, 2016

(54) DISPLAY APPARATUS WITH A FLEXIBLE PRINTED CIRCUIT BOARD

(71) Applicant: Samsung Display Co., Ltd., Yongin, Gyeonggi-do (KR)

(72) Inventor: Soong Yong Joo, Seongnam-si (KR)

(73) Assignee: Samsung Display Co., Ltd., Yongin (KR)

( * ) Notice: Subject to any disclaimer, the term of this patent is extended or adjusted under 35 U.S.C. 154(b) by 192 days.

(21) Appl. No.: 13/943,557

(22) Filed: Jul. 16, 2013

(65) Prior Publication Data

US 2014/0022744 A1 Jan. 23, 2014

(30) Foreign Application Priority Data

Jul. 18, 2012 (KR) .................. 10-2012-0078302

(51) Int. Cl.
| | |
|---|---|
| *H05K 1/14* | (2006.01) |
| *H05K 1/11* | (2006.01) |
| *H05K 5/00* | (2006.01) |
| *H05K 1/02* | (2006.01) |
| *F21V 8/00* | (2006.01) |
| *G02F 1/1333* | (2006.01) |
| *G02F 1/1335* | (2006.01) |
| *G02F 1/1345* | (2006.01) |
| *G02F 1/1362* | (2006.01) |
| *H05K 1/18* | (2006.01) |

(52) U.S. Cl.
CPC ............ *H05K 5/0017* (2013.01); *G02B 6/0083* (2013.01); *H05K 1/0259* (2013.01); *H05K 1/0277* (2013.01); *H05K 1/118* (2013.01); *G02F 1/13454* (2013.01); *G02F 1/133308* (2013.01); *G02F 1/133615* (2013.01); *G02F 1/136204* (2013.01); *G02F 2202/22* (2013.01); *H05K 1/189* (2013.01); *H05K 2201/10128* (2013.01)

(58) Field of Classification Search
CPC .. G02F 1/13452; H05K 1/147; H05K 1/0218; H05K 1/0219; H05K 1/0244; H05K 1/0225; H05K 1/0227; H05K 5/0017
See application file for complete search history.

(56) References Cited

U.S. PATENT DOCUMENTS

| | | | | |
|---|---|---|---|---|
| 5,296,651 | A * | 3/1994 | Gurrie ................. | H05K 1/0218 174/250 |
| 5,436,745 | A * | 7/1995 | Voisin et al. ................. | 349/58 |
| 5,739,887 | A * | 4/1998 | Ueda et al. ................. | 349/149 |
| 7,936,565 | B2 * | 5/2011 | Muro .................... | G06F 1/1616 174/521 |
| 8,411,002 | B2 * | 4/2013 | Lee et al. ................. | 345/87 |
| 2002/0157865 | A1 * | 10/2002 | Noda ................. | H05K 1/0219 174/261 |
| 2003/0193787 | A1 * | 10/2003 | Manabe ................. | H05K 1/028 361/752 |

(Continued)

FOREIGN PATENT DOCUMENTS

| | | | | |
|---|---|---|---|---|
| JP | 2002151807 | A | * | 5/2002 |
| JP | 2009186777 | A | * | 8/2009 |

*Primary Examiner* — Jeremy C Norris  
*Assistant Examiner* — Nathan Milakovich  
(74) *Attorney, Agent, or Firm* — Knobbe Martens Olson & Bear LLP (57) ABSTRACT

A flexible printed circuit board and a display apparatus including the same, which can prevent damage due to static electricity is disclosed. The flexible printed circuit board includes a signal line region and a ground region protruding from the signal line region, wherein the external periphery of the signal line region is a conductive pattern unformed region where a conductive pattern is not formed. Additionally, at least a portion of the external periphery of the ground region is a conductive pattern formed region where a conductive pattern is formed.

21 Claims, 6 Drawing Sheets

(56) References Cited

U.S. PATENT DOCUMENTS

| | | | |
|---|---|---|---|
| 2005/0122700 A1* | 6/2005 | Kim et al. ..................... 361/795 |
| 2008/0068313 A1* | 3/2008 | Jang ................................ 345/87 |
| 2008/0144295 A1* | 6/2008 | Wang et al. .................. 361/750 |
| 2009/0135364 A1* | 5/2009 | Lee et al. ...................... 349/149 |
| 2011/0120770 A1* | 5/2011 | Yokonuma ........... H05K 1/0215 174/94 S |
| 2011/0134161 A1* | 6/2011 | Son ..................... G02B 6/0083 345/690 |
| 2011/0199741 A1* | 8/2011 | Yokonuma .................... 361/749 |
| 2012/0092838 A1* | 4/2012 | Kitano et al. ................. 361/749 |
| 2012/0200545 A1* | 8/2012 | Takahashi et al. ............ 345/204 |
| 2012/0293470 A1* | 11/2012 | Nakata .......................... 345/204 |
| 2013/0010216 A1* | 1/2013 | Kang .................... G06F 3/0412 349/12 |
| 2013/0207933 A1* | 8/2013 | Mamba et al. ................ 345/174 |
| 2015/0022741 A1* | 1/2015 | Nii et al. ......................... 349/12 |

* cited by examiner

DISPLAY APPARATUS WITH A FLEXIBLE PRINTED CIRCUIT BOARD

CROSS-REFERENCE TO RELATED APPLICATIONS

This application claims priority from Korean Patent Application No. 10-2012-0078302 filed on Jul. 18, 2012 in the Korean Intellectual Property Office, the disclosure of which is incorporated herein by reference in its entirety.

BACKGROUND

1. Field of the Invention

The present invention relates to a display apparatus, and more particularly, to a display apparatus having a flexible printed circuit board.

2. Description of the Related Technology

Recent years have witnessed the widespread use of display apparatuses in a wide variety of products, including a television, a monitor, a notebook computer, a mobile phone, a personal digital assistant (PDA), a smart phone, and so on. Various product groups employing a display apparatus have different specification requirements. However, increasing the resolution of a display apparatus or reduction of the thickness of the display apparatus are common requirements, irrespective of product groups. To cope with the requirements, recently proposed display apparatuses include high-performance driving chips mounted therein to allow as many signal lines as possible to be densely populated in a narrow area and to process complex signals.

Meanwhile, the display apparatus is liable to be frequently exposed to external static electricity from the environment in which the display apparatus is used.

In particular, with the recent emphasis on the mobility of a display apparatus, the display apparatus is used in a variety of environments. Thus, a display apparatus may become more frequently exposed to the external static electricity. If static electricity is externally applied to the display apparatus, display quality may deteriorate and elements such as driving chips connected to signal lines may be damaged.

The present disclosure describes ways to effectively release the induced static electricity, including forming a ground pad on a flexible printed circuit board to make the same contact a sidewall of a bottom chassis. Since cutting is generally performed in the course of forming a flexible printed circuit board, a conductive pattern formed at an external periphery of the flexible printed circuit board is prone to damage. Therefore no conductive pattern is formed at the external periphery of the flexible printed circuit board. With this configuration in which a ground pad is formed on a flexible printed circuit board and contacts a sidewall of a bottom chassis, since there is no conductive pattern formed at the periphery at which the ground pad is stably brought into close contact with the bottom chassis due to a resilient force, ground contact resistance may increase, making it difficult to effectively release the induced static electricity.

SUMMARY OF CERTAIN INVENTIVE ASPECTS

The present disclosure provides a flexible printed circuit board, which can effectively release static electricity induced thereto. The flexible printed circuit board may be disposed within a display apparatus.

One aspect disclosed herein relates to a flexible printed circuit board comprising a signal line region having an external periphery; a ground region having an external periphery, the ground region protruding in a first direction from the signal line region; wherein the external periphery of the signal line region comprises a region where no conductive pattern is formed, and the external periphery of the ground region comprises a region where a conductive pattern is formed.

In some embodiments, the conductive pattern is formed on the entire external periphery of the ground region.

In some embodiments, the ground region includes a plurality of external peripheral sides, wherein the external peripheral side having a minimum angle formed with respect to a direction perpendicular to the first direction comprises a region where a conductive pattern is formed.

In some embodiments, the flexible printed circuit board comprises a panel connection region having an external periphery, the panel connection region protruding from the signal line region in a second direction, wherein the external periphery of the panel connection region is a region where no conductive pattern is formed.

In some embodiments, the first direction is perpendicular to the second direction.

In some embodiments, the first direction is parallel to the second direction.

In some embodiments, the ground region comprises a first ground region protruding from the signal line region in a third direction perpendicular to the second direction; and a second ground region protruding from the signal line region in the same direction as the second direction.

In some embodiments, the signal line region is covered by a passivation layer, and the ground region is not covered by the passivation layer.

Another aspect disclosed herein relates to a flexible printed circuit board comprising a base film; a signal line region comprising an external periphery; and a flexible printed circuit board comprising a conductive pattern formed on one surface of the base film, wherein a first portion of the external periphery of the signal line region is no conductive pattern formed thereon, and a second other portion of the external periphery of the signal line region has a conductive pattern formed thereon.

In some embodiments, the second portion of the external periphery of the signal line region is a ground region.

Another aspect disclosed herein relates to a display apparatus comprising a display panel; a bottom chassis configured to receive the display panel; and a flexible printed circuit board attached to a side of the display panel, comprising a signal line region and a ground region protruding from the signal line region, wherein an external periphery of the signal line region has no conductive pattern formed thereon, and at least a portion of an external periphery of the ground region has a conductive pattern formed thereon.

In some embodiments, at least a portion of the external periphery of the ground region contacts a sidewall of the bottom chassis.

In some embodiments, the entire external periphery of the ground region of the flexible printed circuit board has a conductive pattern formed thereon.

In some embodiments, the ground region includes a plurality of external peripheral sides, among which the external peripheral side having a minimum angle formed with respect to a direction perpendicular to a direction in which the ground region protrudes from the signal line region has a conductive pattern formed thereon.

In some embodiments, the flexible printed circuit board further comprises a panel connection region, wherein an external periphery of the panel connection region has no conductive pattern formed thereon.

In some embodiments, the ground region of the flexible printed circuit board protrudes from the signal line region in a direction perpendicular to the direction in which the panel connection region protrudes from the signal line region.

In some embodiments, at least a portion of the external periphery of the ground region of the flexible printed circuit board contacts a sidewall of the bottom chassis, which is adjacent to the side of the display panel to which the flexible printed circuit board is attached.

In some embodiments, the ground region of the flexible printed circuit board protrudes from the signal line region in the same direction as the direction in which the panel connection region protrudes from the signal line region.

In some embodiments, at least a portion of the periphery of the ground region of the flexible printed circuit board contacts a sidewall of the bottom chassis, which is adjacent to the side of the display panel to which the flexible printed circuit board is attached.

In some embodiments, the ground region comprises a first ground region protrudes from the signal line region in a direction perpendicular to the direction in which the panel connection region protrudes from the signal line region; and a second ground region protrudes from the signal line region in the same direction as the direction in which the panel connection region protrudes from the signal line region.

In some embodiments, the signal line region is covered by a passivation layer, and the ground region is not covered by the passivation layer.

Since contact resistance between a ground pad and a bottom chassis in a flexible printed circuit board installed in the display apparatus is reduced, the induced static electricity can be rapidly released to the bottom chassis. Therefore, damage to a device caused by induction of static electricity or reduction of display quality can be suppressed.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims.

It will be understood that when an element or layer is referred to as being "on" another element or layer, it can be directly on the other element or layer or intervening elements or layers may be present. Like numbers refer to like elements throughout.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

Hereinafter, a display apparatus will be described with regard to a liquid crystal display by way of example, but aspects of the present invention display apparatus are not limited thereto. The present disclosure can be applied to other types of display apparatuses such as an organic light emitting display (OLED) apparatus, a plasma display panel (PDP), and the like.

Figure 1:
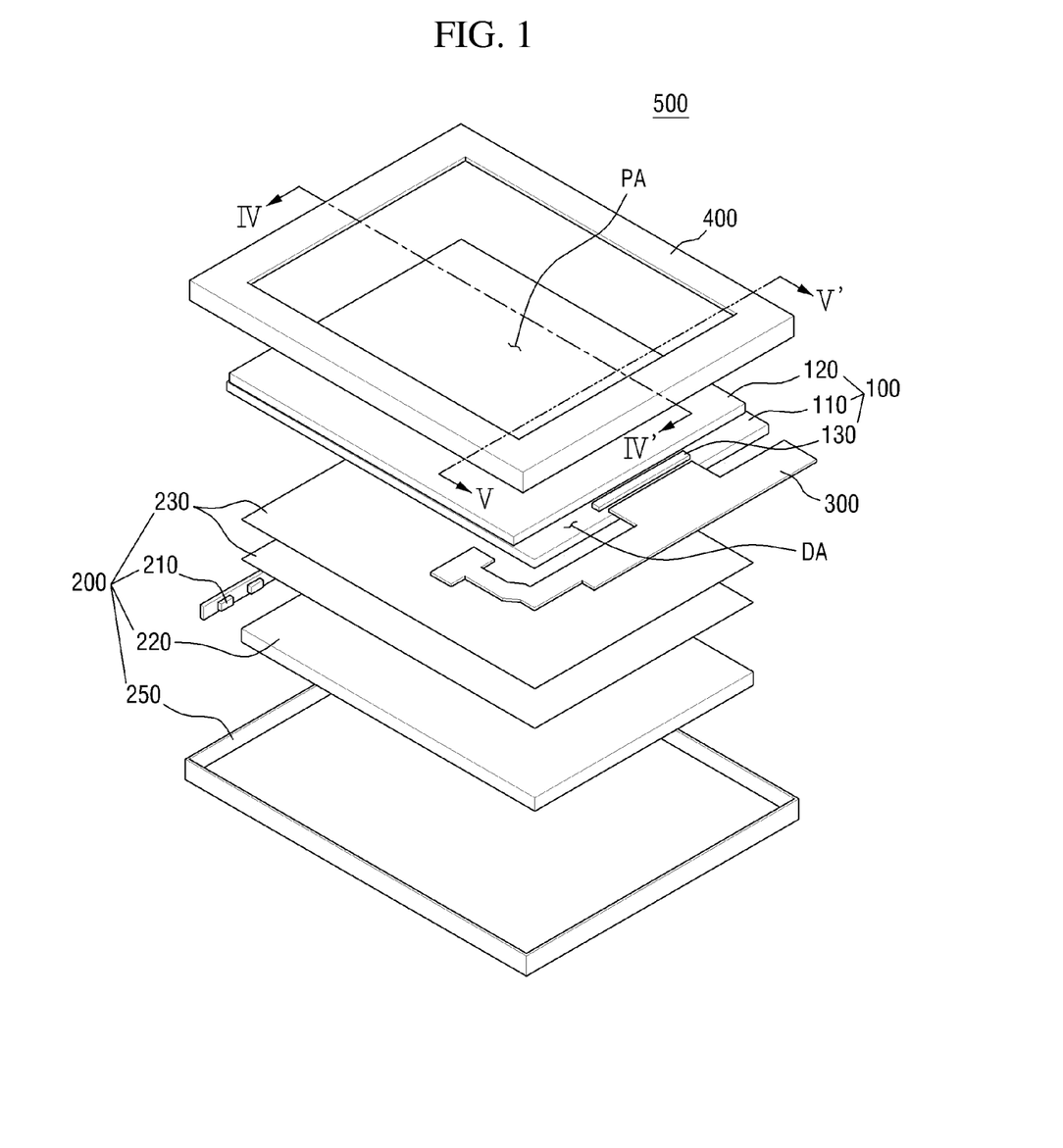
FIG. 1 is an exploded perspective view of an embodiment of a display apparatus.

FIG. 1 is an exploded perspective view of a display apparatus. Referring to FIG. 1, the display apparatus may include a display panel 100 and a light source assembly 200.

The display panel 100 includes a first display substrate 110, a second display substrate 120 facing the first display substrate 110, and a flexible printed circuit board (FPC) 300 attached to the first display substrate 110.

The first display substrate 110 may have a pixel area (PA) and a driving area (DA). The pixel area (PA) of the first display substrate 110 overlaps the second display substrate 120 while the driving area (DA) is not covered by the second display substrate 120 but is exposed.

The pixel area (PA) of the first display substrate 110 may include a plurality of gate lines extending in a first direction, a plurality of data lines extending in a second direction perpendicular to the first direction (not shown). A thin film transistor (not shown) that is a switching element may be formed at an intersection of each of the gate lines and each of the data lines. A pixel electrode (not shown) may be disposed in a region defined by the gate line and the data line. A gate electrode that is a control terminal of the thin film transistor is connected to the gate line, a source electrode that is an input terminal of the thin film transistor is connected to the data line, and a drain electrode that is an output terminal of the thin film transistor is connected to the pixel electrode through a contact (not shown). A channel of the thin film transistor may be formed as a semiconductor layer. The semiconductor layer may be disposed to overlap the gate electrode. The source electrode and the drain electrode may be spaced apart from each other about the semiconductor layer.

A driver for applying a driving signal to the pixel area (PA) may be formed in the driving area (DA) of the first display substrate 110. As an example of the driver, a driver IC 130 mounted in the driving area (DA) is illustrated. In addition, a plurality of lines for inputting/outputting signals to/from the driver IC 130 may be formed in the driving area (DA) of the first display substrate 110. Lines positioned at one side of the driver IC 130 are connected to the gate lines and the data lines.

A plurality of bonding pads (not shown) may be formed in the driving area (DA) of the first display substrate 110 positioned at the other side of the driver IC 130. At least some of the bonding pads are electrically connected to the driver IC 130 through the signal lines. In addition, the flexible printed circuit board 300 may be attached to the bonding pads by means of an anisotropically conductive film. The flexible printed circuit board 300 will later be described.

The second display substrate 120 is disposed to face the first display substrate 110. The second display substrate 120 may include a plurality of red, green and blue color filters (not shown). Each color filter may correspond to each pixel electrode. Black matrixes may be disposed at boundaries and outermost parts of the respective color filters. A common electrode may be formed on the entire surface of the color filters.

A liquid crystal layer (not shown) may be interposed between the first display substrate 110 and the second display substrate 120. Alignment layers may be formed on surfaces of the first and second display substrate 110 and 120 contacting the liquid crystal layer.

A sealing member (not shown), such as a sealant, may be disposed between the first display substrate 110 and the second display substrate 120 along peripheral parts of the respective display substrates 110 and 120 to make the first display substrate 110 and the second display substrate 120 combined to each other to be hermetically sealed.

A light source assembly 200 is disposed under the display panel 100. The light source assembly 200 may include a light source 210, a light guide plate 220 that guides light emitted from the light source 210, and at least one optical sheet 230 that is disposed above the light guide plate 220 and modulates optical properties of the emitted light.

The light source 210 is formed at one side of the light guide plate 220. The light source 210 may include, for example, a light emitting diode (LED), a cold cathode fluorescent lamp (CCFL), a hot cathode fluorescent lamp (HCF), an external electrode fluorescent lamp (EEFL), and so on. Alternatively, the light source 210 may be formed at both sides of the light guide plate 220.

The light guide plate 220 moves the light emitted from the light source 210 using total internal reflection and upwardly emits the light through a scattering pattern formed on the bottoms surface of the light guide plate 220. Although not shown, a reflection sheet is formed under the light guide plate 220 to allow the downwardly emitted light from the light guide plate 220 to be upwardly reflected back.

The at least one optical sheet 230 is disposed on the light guide plate 220. The at least one optical sheet 230 may include, for example, a diffusion film for diffusing incident light, a prism sheet for collecting the incident light, a brightness enhancing film for partially reflecting the incident linear polarized light, a liquid crystal film for partially reflecting the incident circular polarized light, a retardation film for changing circular polarized light into linear polarized light, and/or a protective film, or a combination of optical sheets 230 providing different properties may be used.

The light source 210, the light guide plate 220, and the optical sheet 230 may be configured to fit in or be received by the bottom chassis 250. The display panel 100 may also be configured to fit in or be received by the bottom chassis 250. The bottom chassis 250 may be made of a conductive material, for example, a metal. The bottom chassis 250 may have a bottom surface and sidewalls. The bottom surface of the bottom chassis 250 may be rectangular. In this case, the bottom chassis 250 may have four sidewalls.

Although not shown, the light source assembly 200 may further include a mold frame. In this case, the light source 210, the light guide plate 220 and the optical sheet 230 may be configured to fit in mold frame which is configured to fit in the bottom chassis 250.

The display apparatus may further include a top chassis 400 that covers peripheral parts of the display panel 100 and surrounds side surfaces of the display panel 100 and the light source assembly 200.

Figure 2:
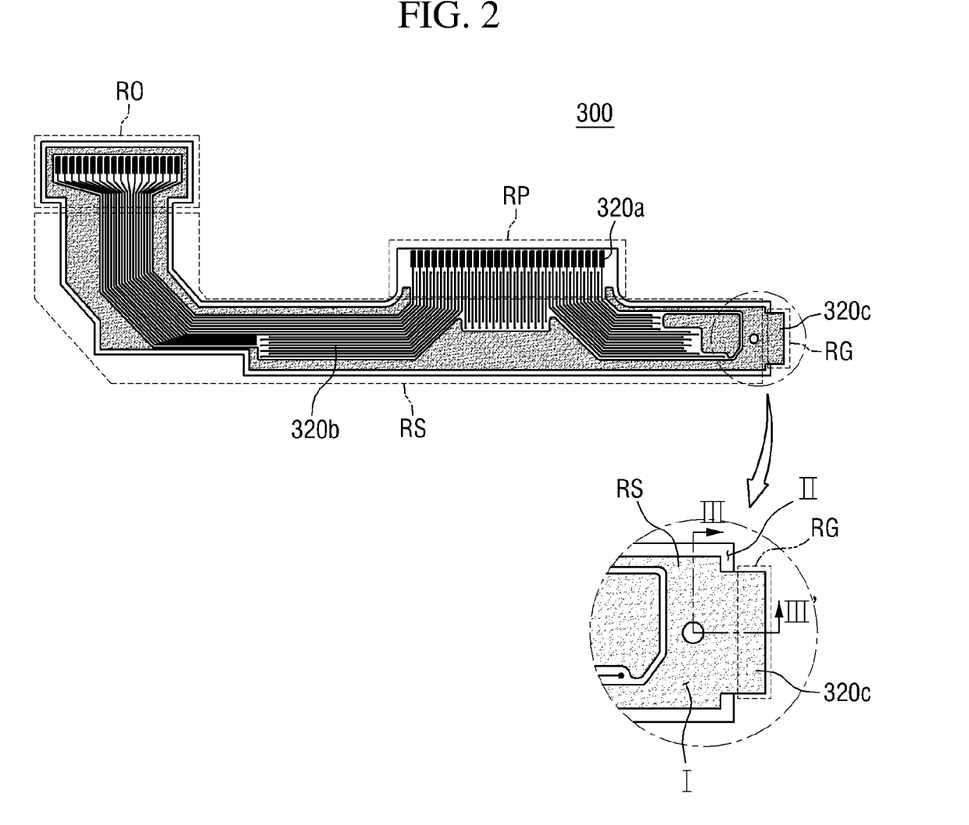
FIG. 2 is a layout view of an embodiment of a flexible printed circuit board.
Figure 3:
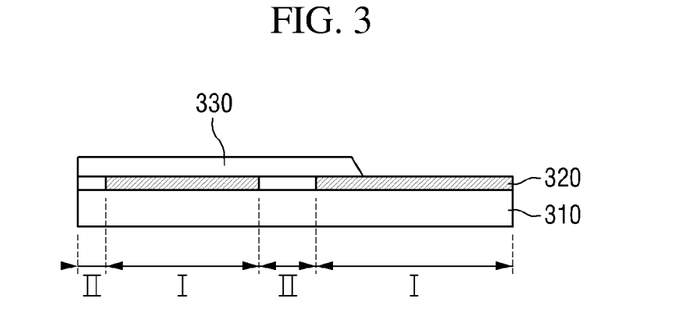
FIG. 3 is a cross-sectional view of the flexible printed circuit board shown in FIG. 2.

FIG. 2 is a layout view of an embodiment of a flexible printed circuit board and FIG. 3 is a cross-sectional view of the flexible printed circuit board shown in FIG. 2.

First, a sectional structure of a flexible printed circuit board will be described. Referring to FIG. 3, as shown from the sectional view, the flexible printed circuit board 300 includes a base film 310, a conductive pattern 320 formed on one surface of the base film 310, and a passivation layer 330 covering at least a portion of the conductive pattern 320.

The base film 310 may be made of, for example, a flexible insulating material such as polyimide.

The conductive pattern 320 may be made of a metal such as copper. The conductive pattern 320 may include a plurality of conductive patterns. The respective conductive patterns may be physically spaced apart from each other and electrically disconnected from each other. The conductive pattern 320 may be formed by patterning a conductive layer. For example, by stacking a conductive layer, such as a copper foil, on the entire surface of the base film 310 and removing the conductive layer of a partial region by etching. The region having the conductive layer may be region (I). A region in which a conductive layer is not formed or is removed once formed to then expose the base film 310 may be referred to as a region II. As shown from the plan view, the flexible printed circuit board 300 may be defined by the conductive pattern region, denoted region I and the conductive pattern unformed region, denoted region II.

The passivation layer 330 covers the conductive pattern 320 and is made of an insulating material to insulate and protect the conductive pattern 320. In some embodiments, the passivation layer 330 may be formed of a coverlay film. In order to make the conductive pattern 320 contact an external device, the passivation layer 330 is formed at a region, so that conductive pattern 320 may be directly exposed to the outside.

Planar arrangement of the flexible printed circuit board 300 having the sectional structure will now be described. Referring to FIG. 2, the flexible printed circuit board 300 may have a panel connection region (RP), a signal line region (RS), an outer terminal connection region (RO), and a ground region (RG).

The panel connection region (RP) is a region attached to the display panel 100 and is positioned at one side of the flexible printed circuit board 300. The panel connection region (RP) may include bonding pads 320a formed of a plurality of conductive patterns. The bonding pads 320a may be exposed to the outside without the passivation layer 330 formed thereon.

The outer terminal connection region (RO) is a region to which other printed circuit boards or input devices are connected and may be positioned at the other side of the flexible printed circuit board 300. Although not shown, the outer terminal connection region (RO) may also include bonding pads formed of conductive patterns.

A plurality of signal lines 320b formed of conductive patterns are positioned in the signal line region (RS), and at least some of the plurality of signal lines 320b may extend to the panel connection region (RP) and/or the outer terminal connection region (RO). The extending signal lines 320b may be connected to the bonding pads 320a. The signal line region (RS) may be covered by the passivation layer 330.

The ground region (RG) may include a ground pad 320c formed of a conductive pattern. The conductive pattern forming the ground pad 320c may have a greater width and/or a wide area than the conductive pattern forming the bonding pads. The ground pad 320c, by making a contact with an external element or device, such as the bottom chassis 250 may release the static electricity induced in the flexible printed circuit board 300.

In the illustrated embodiment, the ground region (RG) is formed to protrude from the signal line region (RS) in a direction perpendicular to the direction in which the panel connection region (RP) protrudes from the signal line region (RS), but aspects of the present invention are not limited thereto.

In some embodiments, the ground pad 320c of the ground region (RG) need not be covered by the passivation layer 330 but may be exposed to the outside.

As described above, the region I and the region II may be disposed over the entire surface of the flexible printed circuit board 300 in various combinations. The external periphery of the flexible printed circuit board 300, excluding the ground region (RG), may be a region II. In other words, the conductive patterns 320 formed on the flexible printed circuit board 300, excluding the ground region (RG), may be spaced apart from the external periphery of the flexible printed circuit board 300. In general, the external periphery of the flexible printed circuit board 300 is a region that is easily exposed to physical, chemical external factors. In addition, the external periphery of the flexible printed circuit board 300 may be a region that is cut to form the flexible printed circuit board 300 to have a desired size and shape. As such, if the signal line 320b associated with data signal transfer, the bonding pads 320a, etc. are directly exposed to external factors or cutting environment, they may be damaged, resulting in inferiority. The inferiority can be prevented by forming the conductive patterns 320 to be spaced a predetermined distance apart from the external periphery of the flexible printed circuit board 300.

Meanwhile, in the ground region (RG) of the flexible printed circuit board 300, the conductive pattern 320 forming the ground pad 320c may extend to the at least a portion of the external periphery of the ground region (RG). In the illustrated embodiment, the external periphery of the ground region (RG) has three external peripheral sides and the ground pad 320c is formed to extend to the external peripheral sides of the ground region (RG). Therefore, in the illustrated embodiment, all of the external peripheral sides of the ground region (RG) may be in the region I. The larger an area of the ground pad 320c, the faster the static electricity can be released to an external element contacting the ground pad 320c. Therefore, the conductive pattern 320 extending to the external periphery is advantageous in releasing the static electricity. Meanwhile, the external periphery of the ground region (RG) may directly contact the external element. If the conductive pattern 320 is formed to extend to the external periphery of the ground region (RG), contact resistance between the conductive pattern 320 and the external element may be reduced, thereby rapidly releasing the static electricity, which will later be described.

In the ground region (RG), even if the conductive pattern 320 is formed to extend to the external periphery, the ground pad 320c simply performs a ground function, such as releasing of static electricity. Therefore, even if the device is partially damaged due to external factors or cutting environment, device inferiority may not occur.

As shown in the plan view of the flexible printed circuit board 300, a portion of the external periphery of the flexible printed circuit board 300 may be a region II, and the other portion of the external periphery of the flexible printed circuit board 300 may be a region I. Here, the region I may be a ground region (RG).

Figure 4:
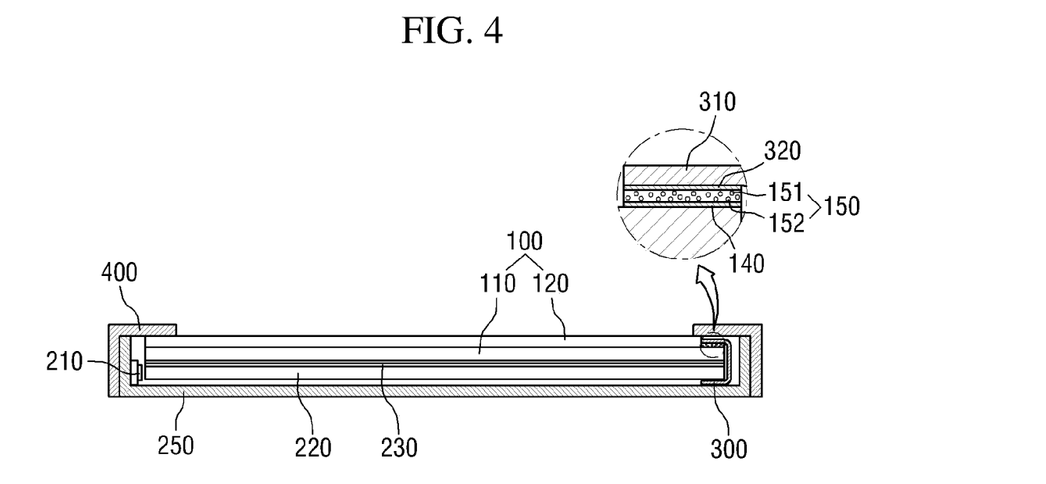
FIG. 4 is a cross-sectional view of an embodiment of the display apparatus according, taken along the line IV-IV' shown in FIG. 1.

Hereinafter, a connection structure of the flexible printed circuit board 300 in the display apparatus will now be described. FIG. 4 is a cross-sectional view of the display apparatus according to an embodiment of the present invention, taken along the line IV-IV' shown in FIG. 1 and FIG. 5 is a cross-sectional view of the display apparatus, taken along the line V-V' shown in FIG. 1.

Figure 5:
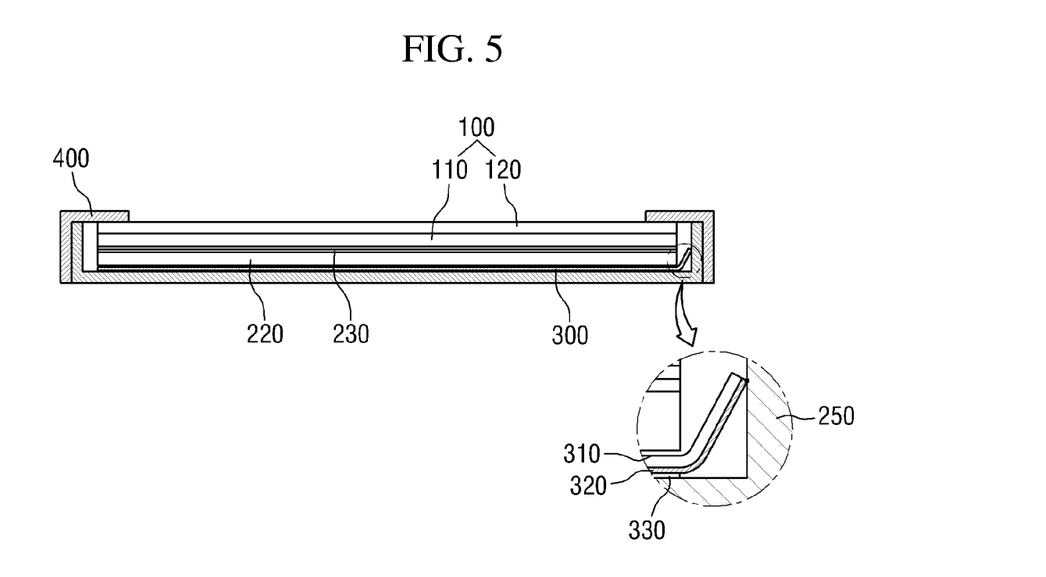
FIG. 5 is a cross-sectional view of the display apparatus taken along the line V-V' shown in FIG. 1.

Referring to FIGS. 4 and 5, in the flexible printed circuit board 300, the panel connection region (RP) is attached to the driving area (DA) of the first display substrate 110. In the attached region, an anisotropically conductive film 150 may be interposed between the flexible printed circuit board 300 and the first display substrate 110. Bonding pads 320a of the flexible printed circuit board 300 are exposed to directly contact a top surface of the anisotropically conductive film 150 without a passivation layer 330 formed thereon. Bonding pads 140 of the first display substrate 110 may directly contact a bottom surface of the anisotropically conductive film 150.

The anisotropically conductive film 150 may include an adhesive resin 151 and conductive balls 152. If heat and pressure are applied to the anisotropically conductive film 150, the conductive balls 152 may electrically connect the bonding pads 320a of the flexible printed circuit board 300 and the bonding pads 140 of the first display substrate 110.

The flexible printed circuit board 300 has a first bend along the sidewall of the display panel 100 and a second bend toward a bottom surface of a light guide plate 220. Accordingly, a signal line region (RS) of the flexible printed circuit board 300 may be received on a bottom surface of a bottom chassis 250. The signal line region (RS) and the bottom chassis 250 may be insulated from each other by the passivation layer 330.

Referring to FIG. 5, ground region (RG) of the flexible printed circuit board 300 is bent toward the sidewall of the bottom chassis 250. The base film 310 of the flexible printed circuit board 300 may have a predetermined resilient force. In this case, as the flexible printed circuit board is bent, the resilient force exerts a force in the ground region (RG) in the direction opposite to the bent direction. Thus, the periphery of the ground region (RG) may be stably brought into close contact with the sidewall of the bottom chassis 250, and held in contact by the resilient force of the ground region (RG).

Since the ground pad 320c of the flexible printed circuit board 300 extends to the periphery of the ground region (RG), the ground pad 320c may stably contact the sidewall of the bottom chassis 250. Therefore, even when the ground pad 320c of the ground region (RG) does have full surface contact with the sidewall of the bottom chassis 250, a contact between the ground pad 320c of at least a portion of the external periphery and the sidewall of the bottom chassis 250 can be ensured. Therefore, contact resistance between the ground pad 320c and the bottom chassis 250 is generally reduced, thereby rapidly releasing the static electricity induced in the flexible printed circuit board 300 to the bottom chassis 250. The sidewall of the bottom chassis 250 which makes contact with the ground region (RG) may be any one of four sidewalls of the bottom chassis 250, which is adjacent to the side of the first display substrate 110 to which the flexible printed circuit board 300 is attached.

Figure 6:
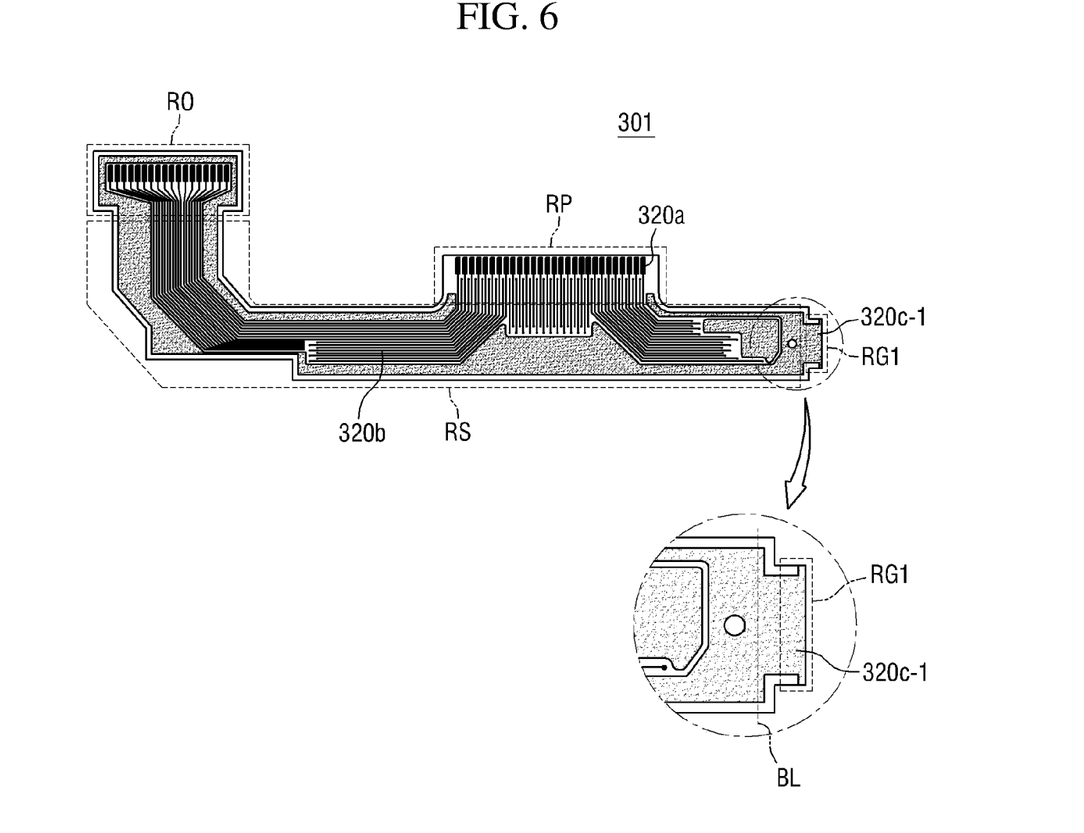
FIG. 6 is a layout view of an embodiment of a flexible printed circuit board.

FIG. 6 is a layout view of an embodiment of a flexible printed circuit board.

Referring to FIG. 6, conductive pattern 320c-1 is selectively formed at a portion of the external periphery of a ground region (RG1). As described in reference to FIGS. 4 and 5, the entire external periphery of the ground region (RG1) is not stably brought into contact with the sidewall of the bottom chassis 250. Rather, only the external periphery corresponding to a side of the ground region (RG1) is stably brought into contact with the bottom chassis 250. Therefore, stable release of static electricity from a ground pad 320c-1 is enabled even if the conductive pattern 320c-1 is formed to extend to only some of a plurality of sides of the external periphery of the ground region (RG1).

In light of the foregoing, if the external periphery has a plurality of peripheral sides, the peripheral side at which the conductive pattern 320c-1 is selectively formed may be a peripheral side that is parallel with a bend line (BL) of the ground region (RG1) or formed at the smallest angle with respect to the bend line (BL). Here, the bend line (BL) may be perpendicular to the direction in which the ground region (RG1) protrudes from the signal line region (RS). In some embodiments, the peripheral side at which the conductive pattern 320c-1 is selectively formed may be a peripheral side that is farthest from the bend line (BL) of the ground region (RG1).

In the illustrated embodiment, the external periphery of the ground region (RG1) has a plurality of peripheral sides, but the external periphery of the ground region (RG1) may be a curved line. In this case, the external peripheral area of the ground region (RG1) in which the conductive pattern 320c-1 is selectively formed may be an area that is formed at the minimum angle with respect to the bend line (BL) and/or an area that is farthest from the bend line (BL).

Figure 7:
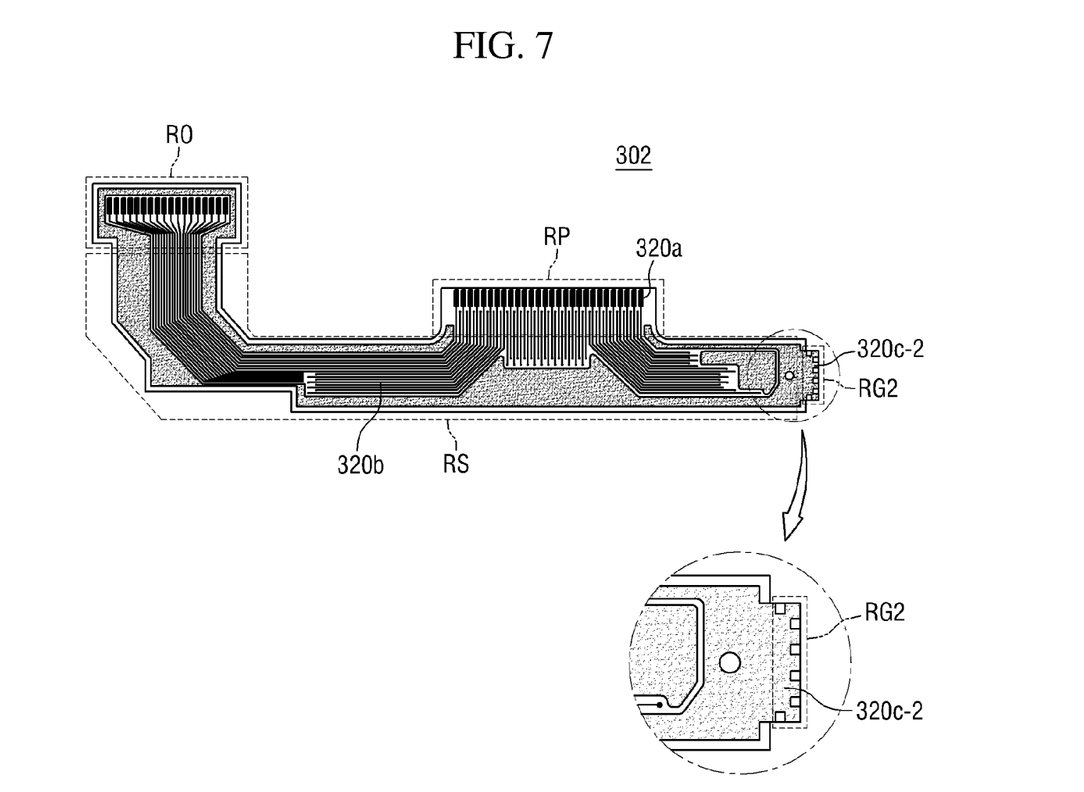
FIG. 7 is a layout view of another embodiment of a flexible printed circuit board.

FIG. 7 is a layout view of another embodiment of a, flexible printed circuit board. Referring to FIG. 7, the flexible printed circuit board 302 has a plurality of external peripheral sides. Region I and region II are both formed in the respective external peripheral sides. In the illustrated embodiment, the region II is positioned at a portion of the external periphery of the ground region (RG2) and the region I is also positioned thereat, thereby allowing a ground pad 320c-2 and a bottom chassis 250 to be stably conducted. Therefore, the static electricity induced to the flexible printed circuit board 302 can be rapidly released toward the bottom chassis 250.

Figure 8:
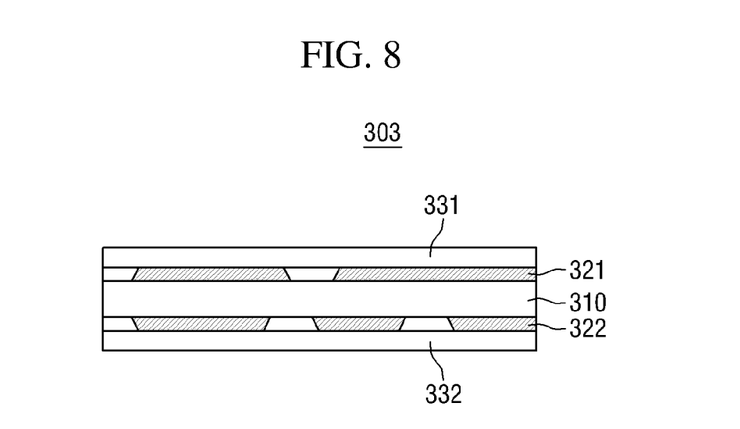
FIG. 8 is a layout view of another embodiment of a flexible printed circuit board.

FIG. 8 is a layout view of another embodiment of a flexible printed circuit board. FIG. 8 illustrates a stacked structure of a plurality of conductive patterns. Referring to FIG. 8, the flexible printed circuit board 303 according to the embodiment of the present invention may include a base film 310, a first conductive pattern 321 formed on one surface of the base film 310, a first passivation layer 331 covering at least a portion of the first conductive pattern 321, a second conductive pattern 322 formed on the other surface of the base film 310, and a second passivation layer 332 covering at least a portion of the second conductive pattern 322. The base film 310, the first conductive pattern 321, and the first passivation layer 331 may be similar to those described with reference to FIGS. 2 and 3. The second conductive pattern 322 is may be similar to the first conductive pattern 321, and may have several different pattern features. The second passivation layer 332 may be substantially similar to the first passivation layer 331. However, the second conductive pattern 322 may be covered by the same area as that covering the first passivation layer 331, but may be covered by a different area from that covering the first passivation layer 331.

Figure 9:
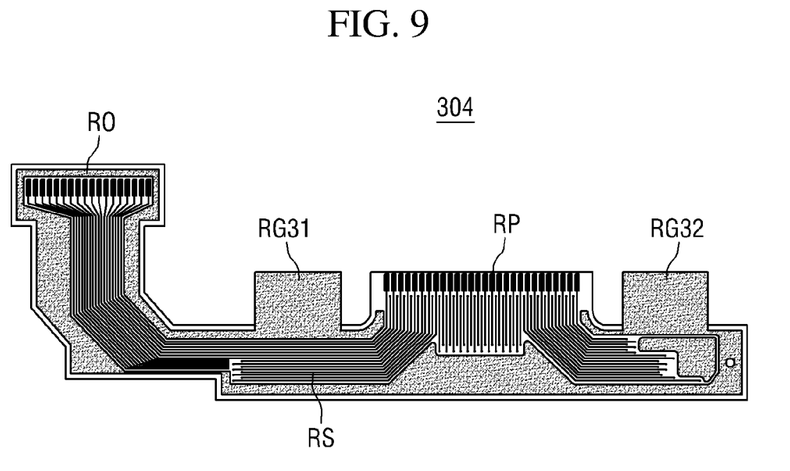
FIG. 9 is a layout view of another embodiment of a flexible printed circuit board.

FIG. 9 is a layout view of another embodiment of a flexible printed circuit board 304. Referring to FIG. 9, in the flexible printed circuit board 304 a ground region (RG) protrudes from a signal line region (RS) to a panel connection region (RP). FIG. 9 illustrates that two ground regions (RG31, RG32) protrude from the signal line region (RS) to the panel connection region (RP), but the present embodiment is exemplary, and the number of ground regions is not limited to two. As the flexible printed circuit board 304 is connected in the display apparatus, the ground regions (RG31, RG32) are stably brought into close contact with a sidewall of a bottom chassis 250, as described in reference to FIGS. 4 and 5. In some embodiments, the sidewalls of the bottom chassis 250 which makes contact with the ground region (RG) may be the sidewall of the flexible printed circuit board 304, which is adjacent to a side of the first display substrate 110.

Figure 10:
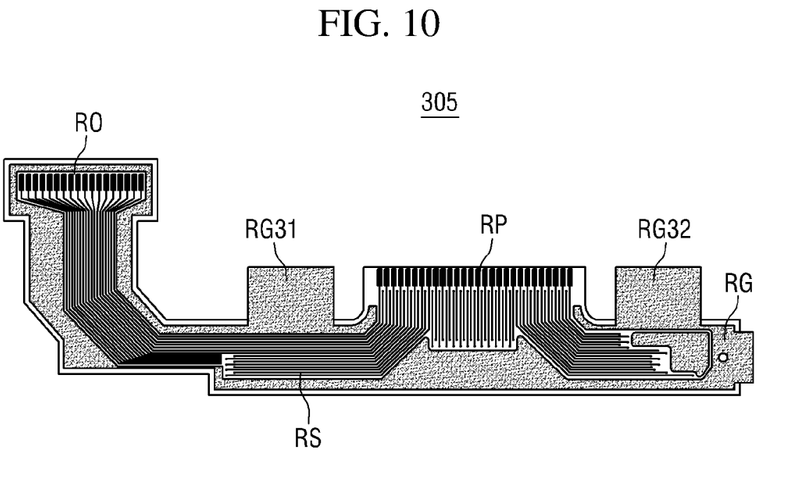
FIG. 10 is a layout view of another embodiment of a flexible printed circuit board.

FIG. 10 is a layout view of an embodiment of a flexible printed circuit board 300. The flexible printed circuit board 305 includes both of a first ground region (RG) similar to that described with reference to FIG. 2 and second ground regions (RG31, RG32) similar to those described with reference to FIG. 9. Therefore, when the flexible printed circuit board 305 is connected to the display apparatus, it can be stably grounded with respect to two sidewalls of the bottom chassis 250, thereby rapidly releasing the static electricity induced to the flexible printed circuit board 305.

Exemplary embodiments of the present invention have been disclosed herein, it is understood that the present invention should not be limited to these preferred embodiments but various changes and modifications can be made by one skilled in the art within the spirit and scope of the present invention as hereinafter claimed.

What is claimed is:

1. A flexible printed circuit board comprising:
   a signal line region formed on a first surface of the flexible printed circuit board;
   a ground region comprising a conductive pattern formed on the first surface of the flexible printed circuit board extending around at least a portion of the signal line region;
   a ground protrusion protruding in a first direction from the ground region;
   wherein the external periphery of the ground region comprises a region where no conductive pattern is formed and the conductive pattern of the ground region is formed at a predetermined distance from an edge of the flexible minted circuit board, except where the ground protrusion extends from the ground region; and
   and wherein an external periphery of the ground protrusion comprises a region where a conductive pattern is formed.

2. The flexible printed circuit board of claim 1, wherein the conductive pattern is formed on the entire external periphery of the ground protrusion.

3. The flexible printed circuit board of claim 1, wherein the ground protrusion includes a plurality of external peripheral sides, wherein the external peripheral side having a minimum angle formed with respect to a direction perpendicular to the first direction comprises a region where a conductive pattern is formed.

4. The flexible printed circuit board of claim 1, wherein the signal region further comprises a panel connection region having an external periphery, the panel connection region protruding from the signal line region in a second direction, wherein the ground region does not extend around the panel connection region, and an external periphery of the panel connection region is a region where no conductive pattern is formed.

5. The flexible printed, circuit board of claim 4, wherein the first direction is perpendicular to the second direction.

6. The flexible printed circuit board of claim 4, wherein the first direction is parallel to the second direction.

7. The flexible printed circuit board of claim 4, wherein the ground protrusion comprises:
a first ground protrusion protruding from the ground region in a third direction perpendicular to the second direction; and
a second ground protrusion protruding from the ground region in the same direction as the second direction.

8. The flexible printed circuit board of claim 1, wherein the signal line region is covered by a passivation layer, and the ground region is not covered by the passivation layer.

9. A flexible printed circuit board comprising:
a base film having a first surface;
a signal line region formed on the first surface of the base film; and
a ground region comprising an external periphery, the ground region at least partially surrounding the signal line region, the ground region having a conductive pattern formed on the first surface of the base film
wherein a first portion of the external periphery of the ground region has no conductive pattern formed thereon, the conductive pattern spaced a predetermined distance apart from an edge of the base film, and a second other portion of the external periphery of the signal line region has a conductive pattern formed thereon.

10. The flexible printed circuit board of claim 9, wherein the second portion of the external periphery of the ground region is a ground protrusion.

11. A display apparatus comprising:
a display panel;
a bottom chassis configured to receive the display panel; and
a flexible printed circuit board attached to a side of the display panel, comprising:
a signal line region,
a ground region formed on a first surface of the flexible printed circuit board, the ground region extending at least partially around the signal line region; and
a ground protrusion extending from the ground region; and
wherein an external periphery of the ground region has no conductive pattern formed thereon and the conductive pattern of the ground region is formed at predetermined distance from an edge of the flexible printed circuit board, except where the ground protrusion extends from the ground region, and wherein a portion of an external periphery of the ground protrusion has a conductive pattern formed thereon.

12. The display apparatus of claim 11, wherein at least a portion of the external periphery of the ground protrusion contacts a sidewall of the bottom chassis.

13. The display apparatus of claim 11, wherein the entire external periphery of the ground protrusion of the flexible printed circuit board has a conductive pattern formed thereon.

14. The display apparatus of claim 11, wherein the ground protrusion includes a plurality of external peripheral sides, among which the external peripheral side having a minimum angle formed with respect to a direction perpendicular to a direction in which the ground protrusion protrudes from the ground region has a conductive pattern formed thereon.

15. The display apparatus of claim 11, wherein the signal region further comprises a panel connection region, wherein the ground region does not extend around the panel connection region, and an external periphery of the panel connection region has no conductive pattern formed thereon.

16. The display apparatus of claim 15, wherein the ground protrusion of the flexible printed circuit board protrudes from the ground region in a direction perpendicular to the direction in which the panel connection region protrudes from the signal line region.

17. The display apparatus of claim 16, wherein at least a portion of the external periphery of the ground protrusion contacts a sidewall of the bottom chassis, which is adjacent to the side of the display panel to which the flexible printed circuit board is attached.

18. The display apparatus of claim 15, wherein the ground protrusion of the flexible printed circuit board protrudes from the ground region in the same direction as the direction in which the panel connection region protrudes from the signal line region.

19. The display apparatus of claim 18, wherein at least a portion of the periphery of the ground protrusion contacts a sidewall of the bottom chassis, which is adjacent to the side of the display panel to which the flexible printed circuit board is attached.

20. The display apparatus of claim 15, wherein the ground protrusion comprises:
a first ground protrusion protruding from the signal line region in a direction perpendicular to the direction in which the panel connection region protrudes from the signal line region; and
a second ground protrusion protruding from the signal line region in the same direction as the direction in which the panel connection region protrudes from the signal line region.

21. The display apparatus of claim 11, wherein the signal line region is covered by a passivation layer, and the ground region is not covered by the passivation layer.

* * * * *